(12) United States Patent
Meiser et al.

(10) Patent No.: US 10,381,477 B2
(45) Date of Patent: Aug. 13, 2019

(54) POWER TRANSISTOR HAVING PERPENDICULARLY-ARRANGED FIELD PLATES AND METHOD OF MANUFACTURING THE SAME

(71) Applicant: Infineon Technologies AG, Neubiberg (DE)

(72) Inventors: Andreas Peter Meiser, Sauerlach (DE); Till Schloesser, Munich (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 15/653,639

(22) Filed: Jul. 19, 2017

(65) Prior Publication Data

US 2018/0026133 A1    Jan. 25, 2018

(30) Foreign Application Priority Data

Jul. 20, 2016   (DE) .................... 10 2016 113 393

(51) Int. Cl.
*H01L 29/06*    (2006.01)
*H01L 29/10*    (2006.01)
(Continued)

(52) U.S. Cl.
CPC ...... *H01L 29/7833* (2013.01); *H01L 29/0653* (2013.01); *H01L 29/0696* (2013.01);
(Continued)

(58) Field of Classification Search
CPC .................... H01L 29/7833–7836; H01L 29/66568–66659;
(Continued)

(56) References Cited

U.S. PATENT DOCUMENTS

| 4,796,070 A | 1/1989 | Black et al. |
| 6,353,252 B1 * | 3/2002 | Yasuhara .............. H01L 21/763 |
| | | 257/487 |

(Continued)

FOREIGN PATENT DOCUMENTS

DE    102004041198 A1    3/2006
DE    102014113087 A1    3/2015

*Primary Examiner* — Marc Anthony Armand
*Assistant Examiner* — Younes Boulghassoul
(74) *Attorney, Agent, or Firm* — Murphy, Bilak & Homiller, PLLC

(57) ABSTRACT

A semiconductor device in a semiconductor substrate having a first main surface includes a transistor array and a termination region. The transistor array includes a source region, a drain region, a body region, a drift zone, and a gate electrode at the body region. The gate electrode is configured to control a conductivity of a channel in the body region. The body region and the drift zone are disposed along a first horizontal direction between the source region and the drain region. The transistor array further includes first field plate trenches in the drift zone. A longitudinal axis of the first field plate trenches extends in the first horizontal direction. The semiconductor device further includes a second field plate trench, a longitudinal axis of the second field plate trench extending in a second horizontal direction perpendicular to the first direction.

13 Claims, 13 Drawing Sheets

(51) Int. Cl.
*H01L 29/40* (2006.01)
*H01L 29/66* (2006.01)
*H01L 29/78* (2006.01)
*H01L 29/417* (2006.01)

(52) U.S. Cl.
CPC ........ *H01L 29/1095* (2013.01); *H01L 29/404* (2013.01); *H01L 29/407* (2013.01); *H01L 29/4175* (2013.01); *H01L 29/41766* (2013.01); *H01L 29/41791* (2013.01); *H01L 29/66575* (2013.01); *H01L 29/66696* (2013.01); *H01L 29/66704* (2013.01); *H01L 29/7823* (2013.01); *H01L 29/7825* (2013.01); *H01L 29/7851* (2013.01)

(58) Field of Classification Search
CPC .................. H01L 29/66681–66704; H01L 29/7816–7826; H01L 29/402–407
See application file for complete search history.

(56) References Cited

U.S. PATENT DOCUMENTS

| | | | |
|---|---|---|---|
| 6,534,823 | B2 | 3/2003 | Hueting et al. |
| 8,847,311 | B2 | 9/2014 | Meiser et al. |
| 9,006,811 | B2 | 4/2015 | Meiser et al. |
| 2006/0006386 | A1* | 1/2006 | Hirler ............... H01L 29/404 257/60 |
| 2006/0076621 | A1* | 4/2006 | Hirler ............... H01L 29/0634 257/343 |
| 2007/0108469 | A1* | 5/2007 | Nakano ............ H01L 29/1083 257/139 |
| 2008/0265329 | A1* | 10/2008 | Hirler ............... H01L 29/0619 257/367 |
| 2009/0032865 | A1* | 2/2009 | Hirler ............. H01L 29/66712 257/328 |
| 2010/0123171 | A1* | 5/2010 | Yang ................ H01L 27/0733 257/272 |
| 2014/0084362 | A1 | 3/2014 | Schloesser et al. |
| 2014/0151798 | A1* | 6/2014 | Meiser ............. H01L 29/7816 257/339 |
| 2015/0076590 | A1* | 3/2015 | Meiser ........... H01L 29/66734 257/330 |
| 2015/0091083 | A1* | 4/2015 | Poelzl .............. H01L 29/407 257/330 |
| 2015/0091088 | A1* | 4/2015 | Vielemeyer ...... H01L 29/7816 257/337 |
| 2015/0137224 | A1* | 5/2015 | Meiser ............. H01L 29/4175 257/331 |
| 2015/0187761 | A1* | 7/2015 | Irsigler ............. H01L 21/225 257/334 |
| 2016/0064559 | A1* | 3/2016 | Tsujiuchi ........ H01L 21/76224 257/409 |

\* cited by examiner

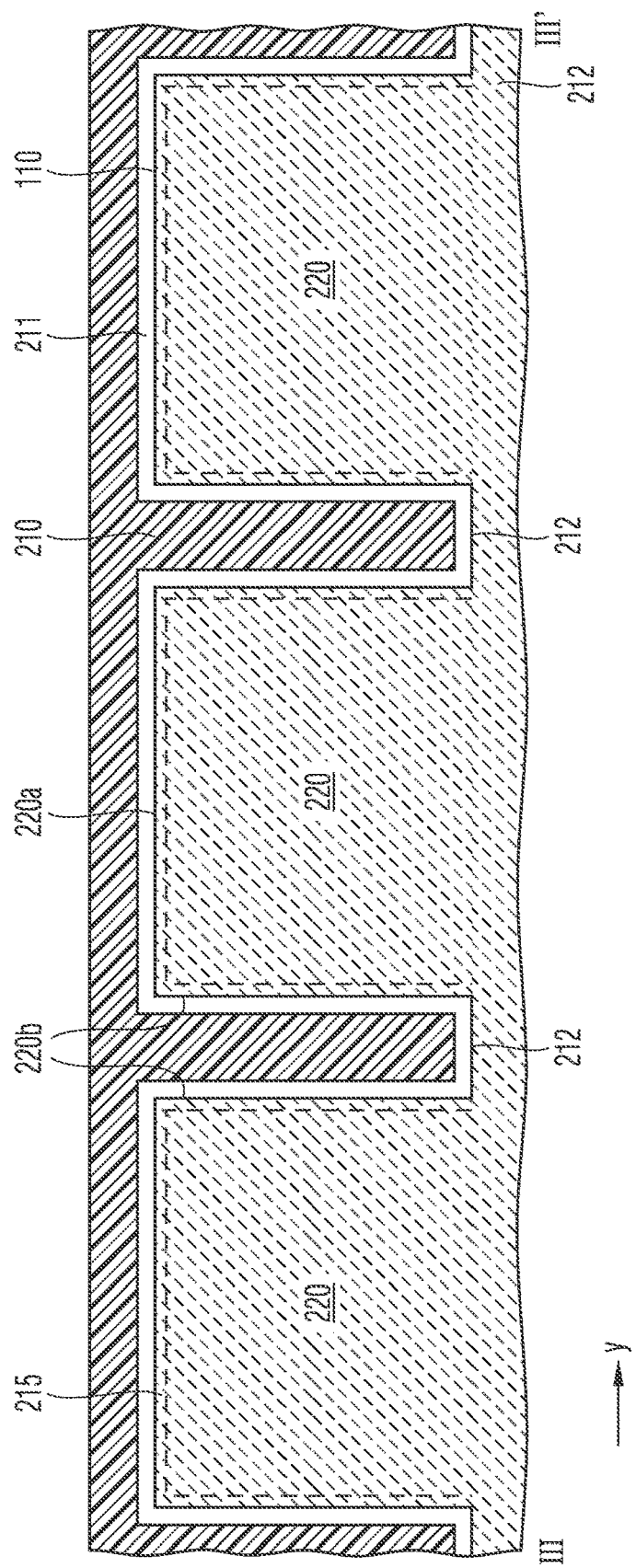

POWER TRANSISTOR HAVING PERPENDICULARLY-ARRANGED FIELD PLATES AND METHOD OF MANUFACTURING THE SAME

BACKGROUND

Power transistors commonly employed in automotive and industrial electronics should have a low on-state resistance ($R_{on} \times A$), while securing a high voltage blocking capability. For example, a MOS ("metal oxide semiconductor") power transistor should be capable, depending upon application requirements to block drain to source voltages Vds of some tens to some hundreds or thousands of volts. MOS power transistors typically conduct very large currents which may be up to some hundreds of amperes at typical gate-source voltages of about 2 to 20 V.

A concept for transistors having a further reduced $R_{on} \times A$ characteristic refers to lateral power FinFETs ("Field Effect Transistor comprising a Fin"). Lateral power FinFETs utilize more bulk silicon for reducing $R_{on}$ so that $R_{on}$ is comparable to that of a vertical trench MOSFET. In transistors comprising a lateral field plate, the doping concentration of the drift zone may be increased, due to the compensation action of the field plate.

It is an object to provide a semiconductor device comprising a termination region having improved properties.

SUMMARY

According to an embodiment, a semiconductor device in a semiconductor substrate having a first main surface includes a transistor array and a termination region. The transistor array comprises a source region, a drain region, a body region, a drift zone, and a gate electrode at the body region. The gate electrode is configured to control a conductivity of a channel in the body region. The body region and the drift zone are disposed along a first horizontal direction between the source region and the drain region. The transistor array further comprising first field plate trenches in the drift zone, a longitudinal axis of the first field plate trenches extending in the first horizontal direction. The semiconductor device further comprises a second field plate trench, the longitudinal axis of the second field plate trench extending in a second horizontal direction perpendicular to the first direction.

According to an embodiment, a semiconductor device comprises a power transistor in a semiconductor substrate. The semiconductor substrate comprises a first semiconductor substrate portion of a first conductivity type at a first main surface of the semiconductor substrate and a second substrate portion of a second conductivity type at the first main surface. The power transistor comprises a drift zone in the first semiconductor substrate portion, a plurality of first field plates in the drift zone, longitudinal axes of the first field plates extending in a first horizontal direction, and a second field plate, the longitudinal axis of the second field plate extending in a second horizontal direction perpendicular to the first direction.

According to a further embodiment, a method of manufacturing a semiconductor device comprising a power transistor in a semiconductor substrate comprises defining a first semiconductor substrate portion of a first conductivity type at a main surface of the semiconductor substrate and a second semiconductor substrate portion of a second conductivity type at the main surface, to form a drift zone in the first semiconductor substrate portion. The method further comprises forming a plurality of first field plates in the drift zone, longitudinal axes of the first field plates extending in a first horizontal direction, and forming a second field plate, the longitudinal axis of the second field plate extending in a second horizontal direction perpendicular to the first direction.

Those skilled in the art will recognize additional features and advantages upon reading the following detailed description and on viewing the accompanying drawings.

BRIEF DESCRIPTION OF THE DRAWINGS

The accompanying drawings are included to provide a further understanding of embodiments of the invention and are incorporated in and constitute a part of this specification. The drawings illustrate the embodiments of the present invention and together with the description serve to explain the principles. Other embodiments of the invention and many of the intended advantages will be readily appreciated, as they become better understood by reference to the following detailed description. The elements of the drawings are not necessarily to scale relative to each other. Like reference numbers designate corresponding similar parts.

FIG. 1D shows a further cross-sectional view of the semiconductor device according to an embodiment.

DETAILED DESCRIPTION

Figure 1A:
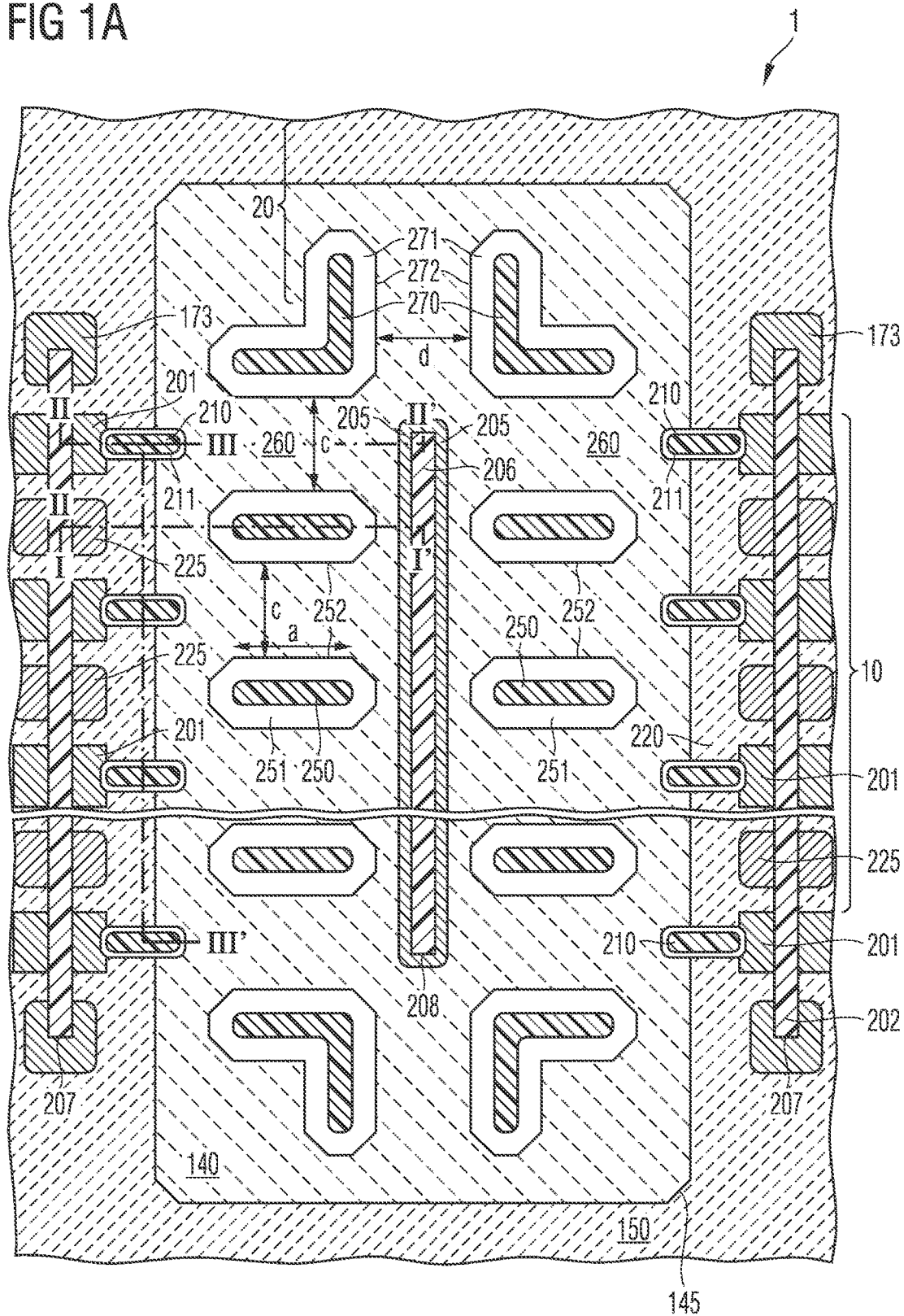
FIG. 1A shows a horizontal cross-sectional view of a semiconductor device according to an embodiment.

In the following detailed description reference is made to the accompanying drawings, which form a part hereof and in which are illustrated by way of illustration specific embodiments in which the invention may be practiced. In this regard, directional terminology such as "top", "bottom", "front", "back", "leading", "trailing" etc. is used with reference to the orientation of the Figures being described. Since components of embodiments of the invention can be positioned in a number of different orientations, the directional terminology is used for purposes of illustration and is in no way limiting. It is to be understood that other embodiments may be utilized and structural or logical changes may be made without departing from the scope defined by the claims.

The description of the embodiments is not limiting. In particular, elements of the embodiments described hereinafter may be combined with elements of different embodiments.

As used herein, the terms "having", "containing", "including", "comprising" and the like are open ended terms that indicate the presence of stated elements or features, but do not preclude additional elements or features. The articles "a", "an" and "the" are intended to include the plural as well as the singular, unless the context clearly indicates otherwise.

As employed in this specification, the terms "coupled" and/or "electrically coupled" are not meant to mean that the elements must be directly coupled together—intervening elements may be provided between the "coupled" or "electrically coupled" elements. The term "electrically connected" intends to describe a low-ohmic electric connection between the elements electrically connected together.

The present specification refers to a "first" and a "second" conductivity type of dopants, semiconductor portions are doped with. The first conductivity type may be p type and the second conductivity type may be n type or vice versa. As is generally known, depending on the doping type or the polarity of the source and drain regions, insulated gate field effect transistors (IGFETs) such as metal oxide semiconductor field effect transistors (MOSFETs) may be n-channel or p-channel MOSFETs. For example, in an n-channel MOSFET, the source and the drain region are doped with n-type dopants. In a p-channel MOSFET, the source and the drain region are doped with p-type dopants. As is to be clearly understood, within the context of the present specification, the doping types may be reversed. If a specific current path is described using directional language, this description is to be merely understood to indicate the path and not the polarity of the current flow, i.e. whether the current flows from source to drain or vice versa. The Figures may include polarity-sensitive components, e.g. diodes. As is to be clearly understood, the specific arrangement of these polarity-sensitive components is given as an example and may be inverted in order to achieve the described functionality, depending whether the first conductivity type means n-type or p-type.

The Figures and the description illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations. In the Figures and the description, for the sake of a better comprehension, often the doped portions are designated as being "p" or "n"-doped. As is clearly to be understood, this designation is by no means intended to be limiting. The doping type can be arbitrary as long as the described functionality is achieved. Further, in all embodiments, the doping types can be reversed.

The terms "lateral" and "horizontal" as used in this specification intends to describe an orientation parallel to a first surface of a semiconductor substrate or semiconductor body. This can be for instance the surface of a wafer or a die.

The term "vertical" as used in this specification intends to describe an orientation which is arranged perpendicular to the first surface of the semiconductor substrate or semiconductor body.

The terms "wafer", "substrate" or "semiconductor substrate" used in the following description may include any semiconductor-based structure that has a semiconductor surface. Wafer and structure are to be understood to include silicon, silicon-on-insulator (SOI), silicon-on sapphire (SOS), doped and undoped semiconductors, epitaxial layers of silicon supported by a base semiconductor foundation, and other semiconductor structures. The semiconductor need not be silicon-based. The semiconductor could as well be silicon-germanium, germanium, or gallium arsenide. According to other embodiments, silicon carbide (SiC) or gallium nitride (GaN) may form the semiconductor substrate material.

FIG. 1A shows a horizontal cross-sectional view of a semiconductor device according to an embodiment. The semiconductor device 1 is formed in a semiconductor substrate having a main surface. The semiconductor device includes a transistor array 10 and a termination region 20. The transistor array 10 comprises a source region 201, a drain region 205, a body region 220, a drift zone 260, and a gate electrode 210 at the body region 220. The gate electrode 210 is configured to control a conductivity of a channel in the body region 220. The body region 220 and the drift zone 260 are disposed along a first horizontal direction, e.g. the x direction between the source region 201 and the drain region 205. The transistor array 10 further comprises first field plate trenches 252 in the drift zone 260. A longitudinal axis of the field plate trenches 252 extends in the first horizontal direction. The semiconductor device 1 further comprises a second field plate trench 272 that extends in a second horizontal direction, e.g. the y direction, which is perpendicular to the first direction. The second field plate trench is arranged at an edge of the transistor array 10, e.g. in or adjacent to the termination region 20. A second field plate 270 is arranged in the second field plate trench 272.

As is illustrated in FIG. 1A, the transistor array 10 comprises a plurality of single transistor cells, each comprising a source region 201, a gate electrode 210 and a first field plate 250. The transistor array 10 further comprises a common drain region 205 that is common to the transistor array 10. As will be illustrated in FIG. 1B, the source regions 201 are electrically connected to a common source terminal 170, the gate electrodes 210 are electrically connected to a common gate terminal 171, and the drain region 205 is electrically connected to a common drain terminal 172. Further, the first field plates 250 may be electrically connected to a common terminal, e.g. the source terminal 170.

As is clearly to be understood, the single components of the single transistor cells may be implemented in a different manner. For example, the source region 201 may be implemented as one common source region which is common to a plurality of parallel transistor cells. Further, the drain region 205 may be separated into single drain regions which are assigned to different parallel transistor cells.

The drift zone 260 may be arranged in a first substrate portion 140 of the first conductivity type and may be a component thereof. The body region 220 is arranged in a second substrate portion 150 of the second conductivity type and may be a component thereof. As is shown in FIG. 1A, the second substrate portion 150 may surround the first substrate portion 140. A boundary 145 between the first and second substrate portions 140, 150 may surround the first field plates 250 and the second field plates 270. Further, the drain contact groove 208 may be arranged in a central portion of the first substrate portion 140 and of the transistor cell array. The drain contact groove 208 may be surrounded by the first field plates 250 and the second field plates 270. The source contact grooves 207 may be disposed outside the first substrate portion 140 in the second substrate portion 150. The source contact grooves 207 may be arranged at an outer edge of the transistor cell array.

The semiconductor device comprises a second field plate trench 272 which extends in the second direction. The second field plate trench is disposed in the termination region 20 in the first substrate portion 140 of the first conductivity type. The second field plate trench 272 is disposed in the vicinity of the second portion 150 of the second conductivity type. In more detail, the first field plate trenches 252 form part of the transistor array 10. The first field plate trenches 252 and the drift zone 260 are arranged in part of the first substrate portion 140. The first substrate portion 140 comprises a further region that extends from the transistor array 10. For example, the further region may extend from the transistor array 10 in a second horizontal direction perpendicular to the first direction. The second field plate trench 272 is arranged in the further region of the first substrate portion 140. The second field plate trench is arranged outside the transistor array 10 in the termination region 20.

According to the embodiment of FIG. 1A, according to one interpretation, the first field plate trench 252 and the second field plate trench 272 may be merged to form a trench having a first longitudinal axis extending in the first direction and a second longitudinal axis extending in the second direction. According to a further interpretation, the second field plate trench 272 extends along a first longitudinal axis and along a second longitudinal axis, the first longitudinal axis running in the first direction and the second longitudinal axis running in the second direction. For example, the second field plate trench 272 may have a shape of or similar to an "L".

When the transistor is switched on, e.g. by applying a suitable voltage to the gate electrode 210, a conductive inversion layer is formed in the body region 220 adjacent to the gate dielectric layer 211. Accordingly, the transistor is in a conducting state between the source region 201 and the drain region 205 via the drain extension region or drift zone 260. A current flow is accomplished along the first direction. In case of switching-off, no conductive channel is formed in the body region 220. Further, carriers present in the drift zone 260 are compensated by the field plate 250 arranged in the first field plate trenches 252. As a consequence, carriers may be depleted from the drift zone 260 resulting in a blocking of the current flow at a high breakdown voltage.

Due to the presence of the second field plate trench extending in the second horizontal direction, the first substrate portion 140 of the first conductivity type may also be compensated in the portion between the drain region 205 and the second substrate portion 150 of the second conductivity type along the second direction. In more detail, a region of the first substrate portion 140, the region being different from the drift zone 260 may be compensated. For example, this region may be the further region as defined before. This region may form part of the termination region 20. As a consequence, a breakdown along the second direction across the junction between the first substrate portion 140 and the second portion 150 of the second conductivity type may be suppressed.

As a result, a termination region 20 may be implemented in a simple manner which is effective for suppressing a breakdown along the second direction.

As is further illustrated in FIG. 1A, the source regions 201 and a body contact portion 225 may be arranged alternatingly along the second direction adjacent to a source contact groove 207 in which a source contact material 202 is disposed. According to an embodiment, as will be in more detail explained below with reference to FIGS. 1B and 1C, the source contact material 202 in the source contact groove may be electrically connected to a source terminal via a back side contact. According to this embodiment, the second substrate portion 150 may be electrically connected to the source terminal via the doped contact portion 173 of the first conductivity type horizontally arranged adjacent to and in contact with the source contact groove 207.

According to the embodiment shown in FIG. 1A, the first field plate trenches 252 may be disposed at a distance c which is measured along the second direction. Further, the first field plate trenches 252 may have a length a measured along the first direction. Further, the semiconductor device may comprise several second field plate trenches 272 which may be arranged at a distance d. Further, a length of the second field plate trench 272 measured in the second direction may be b. According to an embodiment, b=a or b approximately is equal to a. According to an embodiment, c=d or c approximately is equal to d. For example, $|a-b|/a<0.2$ or $0.1$. Further, $|c-d|/c<0.2$ or $0.1$. As a consequence, the breakdown voltage along the second direction may be approximately equal to the breakdown voltage along the first direction.

As is further illustrated in FIG. 1A, the field plates 250 may be arranged at positions in the second direction, so that every one of the gate electrodes is arranged between two adjacent field plates 250 and vice versa. Further, the gate electrode 210 may be arranged adjacent to the source region 201, whereas a body contact portion 225 of the second conductivity type is disposed between adjacent gate electrodes 210. As a result, the body contact portions 225 may be arranged so as to be opposing to field plates 250. The body contact portions 225 may overlap with the field plates 250 along the second direction. The source region 201 and the drain region 205 may be doped with dopants of the first conductivity type, e.g. n type. The body contact portion 225 may be doped with dopants of the second conductivity type, e.g. p type. The body contact portion 225 connects the body region 220 via the source contact filling 202 to the source terminal so as to suppress a parasitic bipolar transistor which could be otherwise formed at this portion.

Figure 1B:
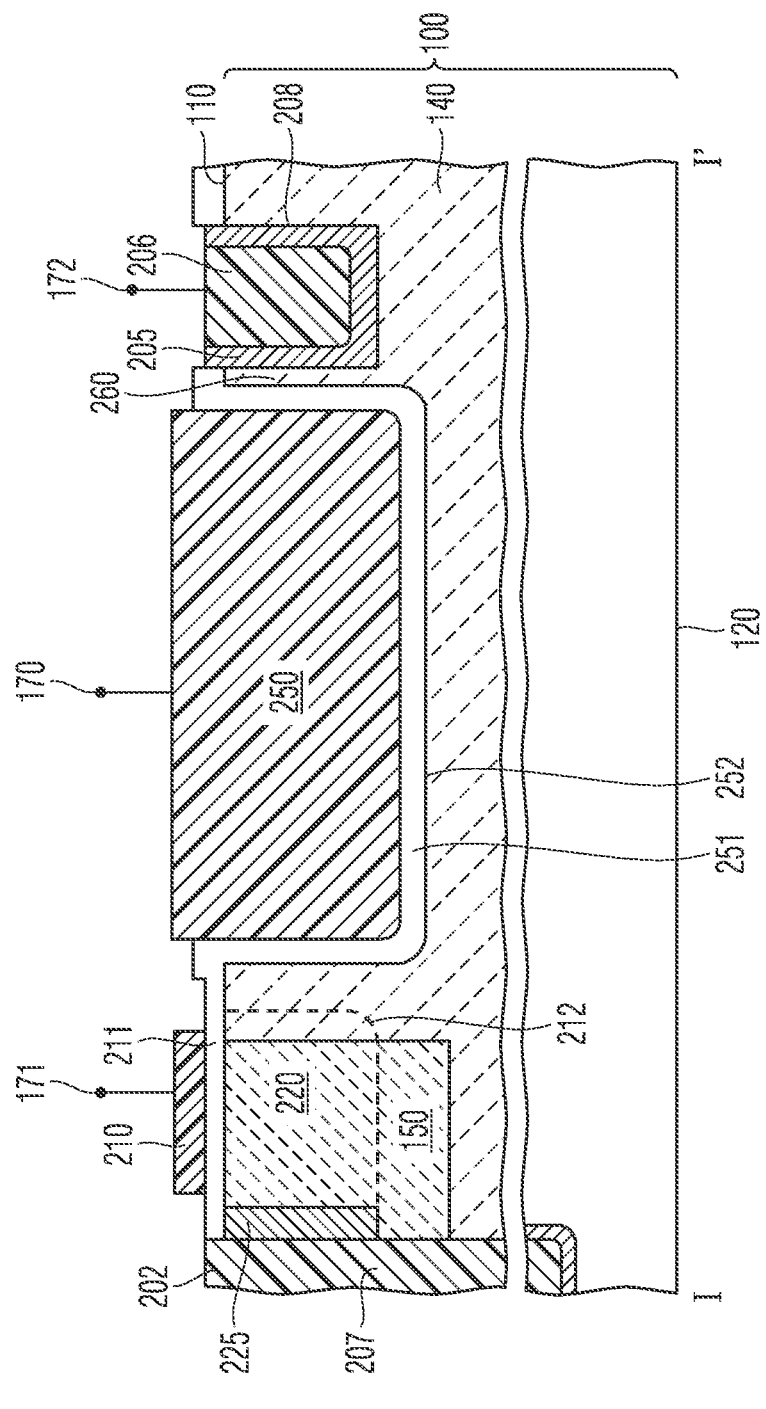
FIG. 1B shows a vertical cross-sectional view of the semiconductor device.

FIG. 1B shows a cross-sectional view of a portion of the semiconductor device shown in FIG. 1A which is taken between I and I'. The cross-sectional view of FIG. 1B is taken so as to intersect the first field plate trench 252. As is shown in FIG. 1B, the semiconductor substrate may comprise a first substrate portion 140 of the first conductivity type and a second substrate portion 150 of the second conductivity type. The first and the second substrate portions 140, 150 are formed at the first main surface 110 of the semiconductor substrate. Further layers may be formed below the respective substrate portions and are omitted herein for the sake of simplicity. The first conductive material 202 is filled in a source contact groove 207 which extends along the second direction. The sidewall of the source contact groove 207 is alternatingly doped with impurities of the first and second conductivity type so as to form the source region 201 (not shown in FIG. 1B) and the body contact portion 225. The body region 220 is formed in the second substrate portion 150 of the second conductivity type.

As is indicated in FIG. 1B, a portion of the gate electrode 210 may be arranged above the body region 220. Further portions of the gate electrode may be disposed in gate trenches 212 before and behind the depicted plane of the drawing. The semiconductor device further comprises first field plate trenches 252 in which a first field plate 250 is arranged. The first field plate 250 may be insulated from adjacent semiconductor material be means of a field dielectric layer 251. The drift zone 260 is arranged in the first semiconductor substrate portion 140 of the first conductivity type. The drain region 205 extends in the semiconductor substrate and may form the sidewall of a drain contact groove 208. A drain contact filling 206, e.g. doped polysilicon or metal may be filled in the drain contact groove 208. The drain contact filling 206 may be electrically connected to a drain terminal 172.

As is shown in FIG. 1B, the source contact groove 207 and the drain contact groove 208 are formed in the first main surface 110 of the semiconductor substrate 100. For example, as will be explained in more detail with reference to FIG. 1C, the source contact filling 202 may be electrically connected to a source terminal 170 via the second main surface 120. Further, the source contact filling may be disconnected from a conductive layer over the first main surface 110. The drain contact filling 206 may be electrically connected to a drain terminal 172 via the first main surface 110. According to further embodiments, the source contact filling 202 may be electrically connected to a source terminal 170 via the first main surface 110 of the semiconductor substrate. Further, the drain contact filling 206 may be electrically connected via the second main surface to the drain terminal 172. In any of these cases the source contact groove 207 and/or the drain contact groove 208 may extend deeper or less deep into the semiconductor substrate 100 than illustrated in the Figures.

Figure 1C:
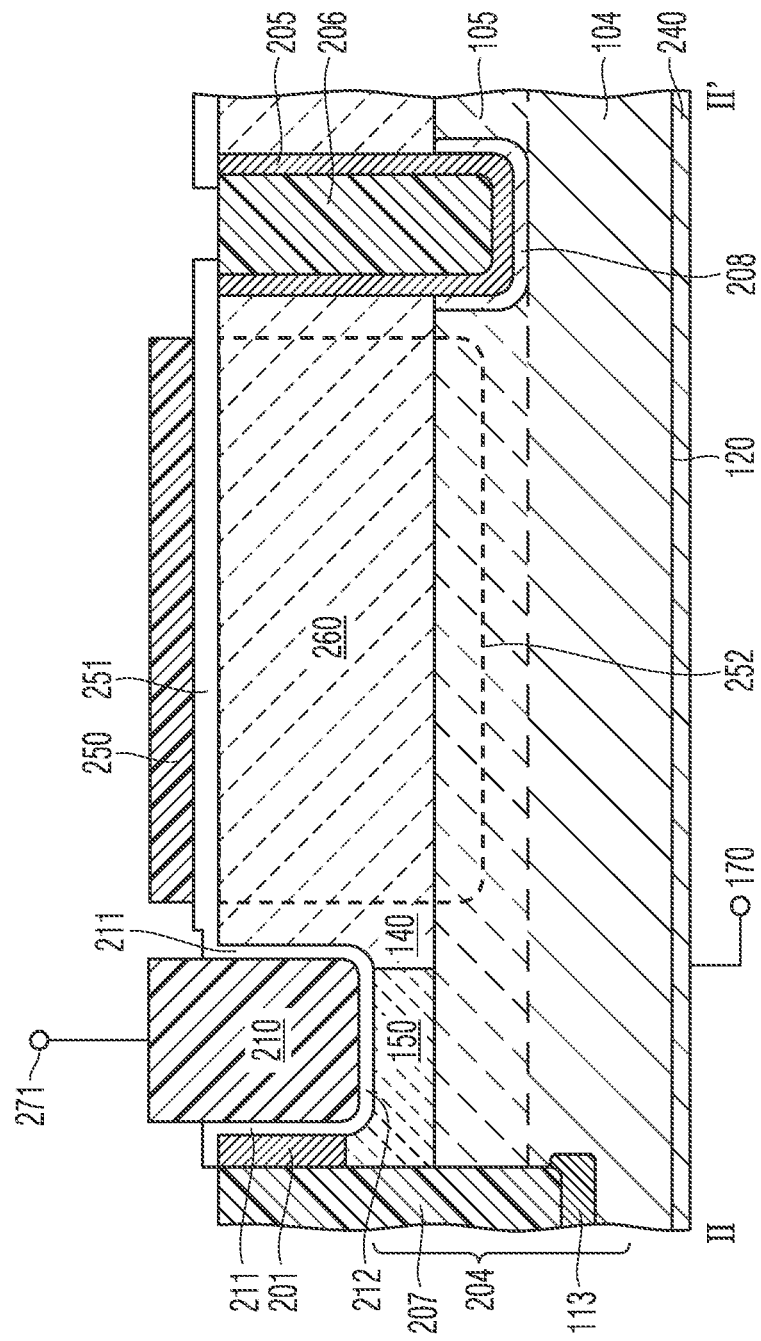
FIG. 1C shows a vertical cross-sectional view of another portion of the semiconductor device.

FIG. 1C shows a cross-sectional view of the semiconductor device taken between II and II'. The cross-sectional view of FIG. 1C is taken so as to intersect the source region 201 and the gate trench 212. As is shown, the gate trench 212 may extend into the depth direction of the substrate. The first field plate trenches 252 are arranged before and behind the depicted plane of the drawing. The source region 201 is formed at a sidewall of the source contact groove 207.

According to the embodiment illustrated in FIG. 1C, the semiconductor device further comprises a source contact electrically connected to the source region 201. The source contact comprises a first source contact portion 204 and a second source contact portion 240. The second source contact portion 240 is disposed at the second main surface 120 of the semiconductor substrate 100. For example, the second source contact portion 240 may be implemented by a back side metallization layer.

The first source contact portion 204 comprises a source contact filling 202 in direct contact with the source region 201. The first source contact portion further comprises a portion of the semiconductor substrate 100 arranged between the source contact filling 202 and the second source contact portion 240. For example, as is illustrated in FIG. 1C, the semiconductor substrate 100 may comprise a base layer 104 of the second conductivity type. An upper portion 105 of the base layer may be doped at a lower doping concentration than a lower portion. The first semiconductor substrate portion 140 and the second semiconductor substrate portion 150 may be arranged over the upper portion 105 of the base layer. According to this embodiment, the first source contact portion 204 may further comprise a portion of the base layer 104.

FIG. 1D shows a cross-sectional view which is taken between III and III' as is also indicated in FIG. 1A. The cross-sectional view of FIG. 1D is taken along the second direction so as to intersect a plurality of gate trenches 212. Due to the fact that the gate electrode 210 is arranged in gate trenches 212, the gate electrode 210 which is filled in the gate trenches 212 extends along a sidewall 220b of the body region 220. As a consequence, a conductive channel 215, which may be formed upon application of a suitable voltage to the gate electrode 210, may be disposed adjacent to a sidewall 220b of the body region and adjacent to a top side 220a of the body region.

Figure 2A:
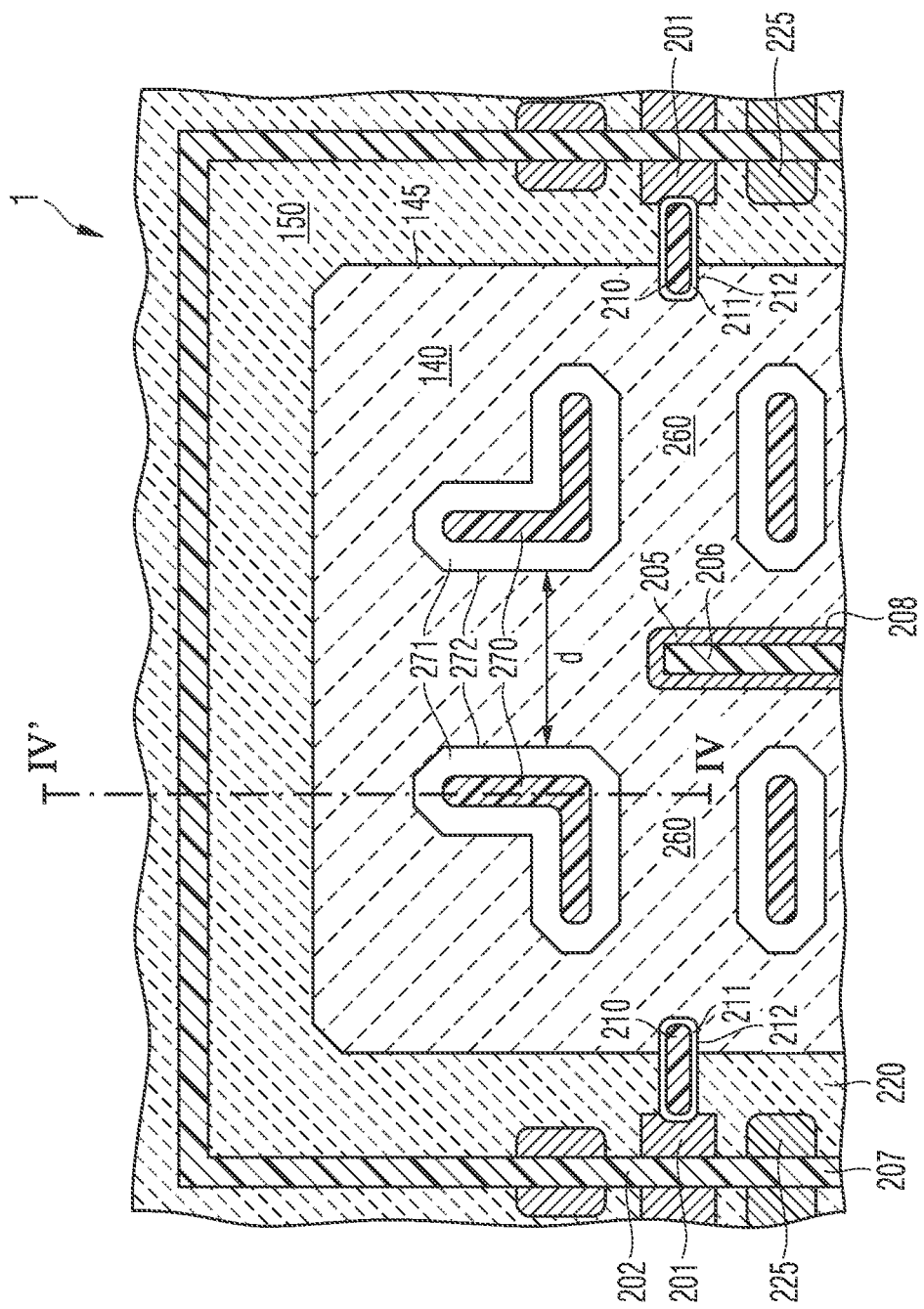
FIG. 2A shows a portion of a semiconductor device according to a further embodiment.
Figure 2B:
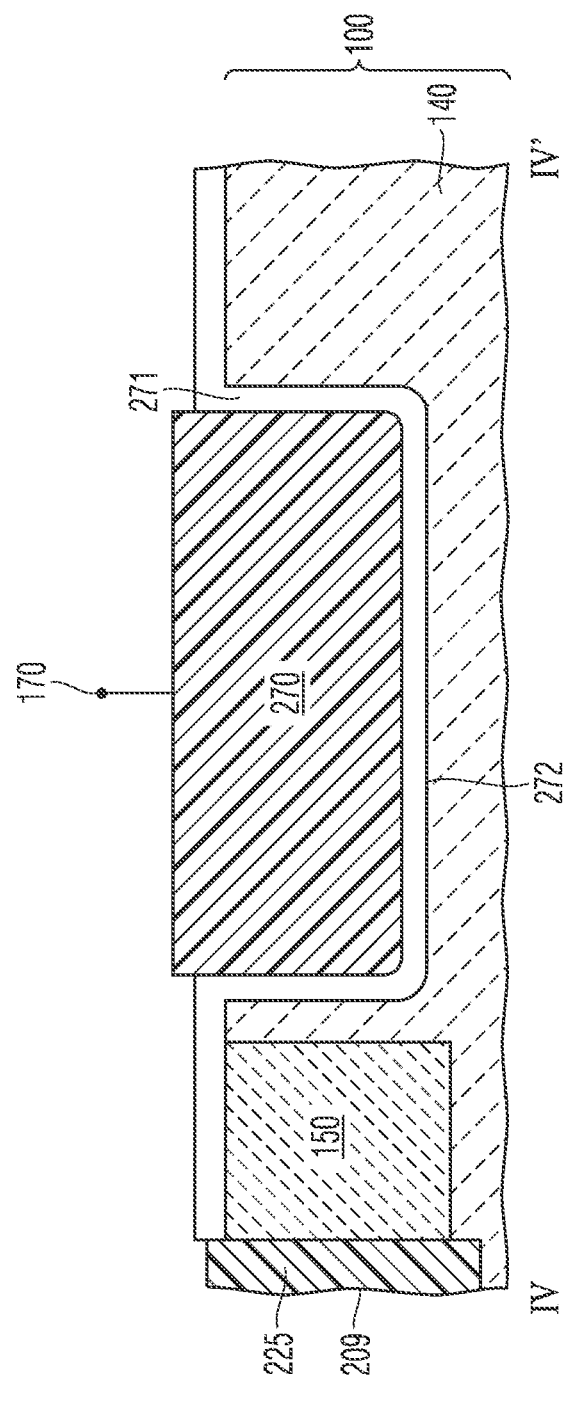
FIG. 2B shows a vertical cross-sectional view of a portion of the semiconductor device according to an embodiment.

FIG. 2A shows a horizontal cross-sectional view of a portion of the semiconductor device according to a further embodiment. Differing from the embodiment shown in FIG. 1A, the source contact groove 207 surrounds the first substrate portion 140 of the first conductivity type to form a termination groove 209. As a result, a parasitic bipolar transistor, e.g. npn transistor, to a second semiconductor device, that may be formed in the same substrate, may be avoided or deteriorated. FIG. 2B shows a vertical cross-sectional view of the semiconductor device shown in FIG. 2A. The cross-sectional view of FIG. 2B is taken between IV and IV' along the second direction. As is shown in the vertical cross-sectional view, the termination groove 209 may be filled with a conductive filling 230. According to an embodiment, a sidewall of the termination groove 209 may be doped. According to further embodiments, a sidewall of the termination groove 209 is not doped. Further, the second field plate trench may be similar to the first field plate trench 252.

Figure 2C:
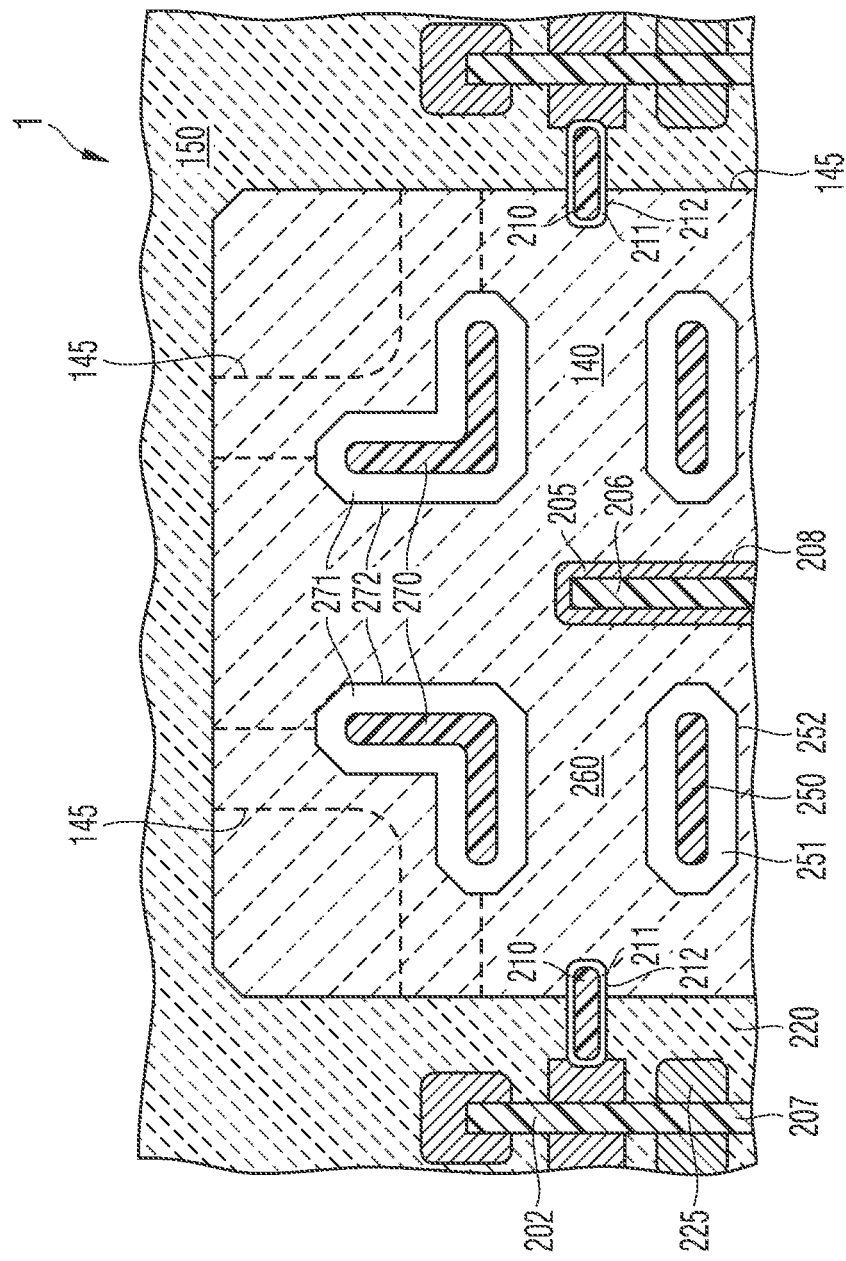
FIG. 2C shows a horizontal cross-sectional view of a portion of the semiconductor device illustrating further modifications.

FIG. 2C shows a horizontal cross-sectional view of a portion of the semiconductor device illustrating further modifications. In particular, according to the embodiment of FIG. 2C, the boundary 145 between the first substrate portion 140 and the second substrate portion 150 may be moved so as to maintain a constant distance to a field plate trench, e.g. the second field plate trench 272. According to further embodiments, the boundary 145 may be moved so as to intersect at least a part of the second field plate trenches 272. Due to these different shapes, the breakdown characteristics may be made more uniform.

Figure 3:
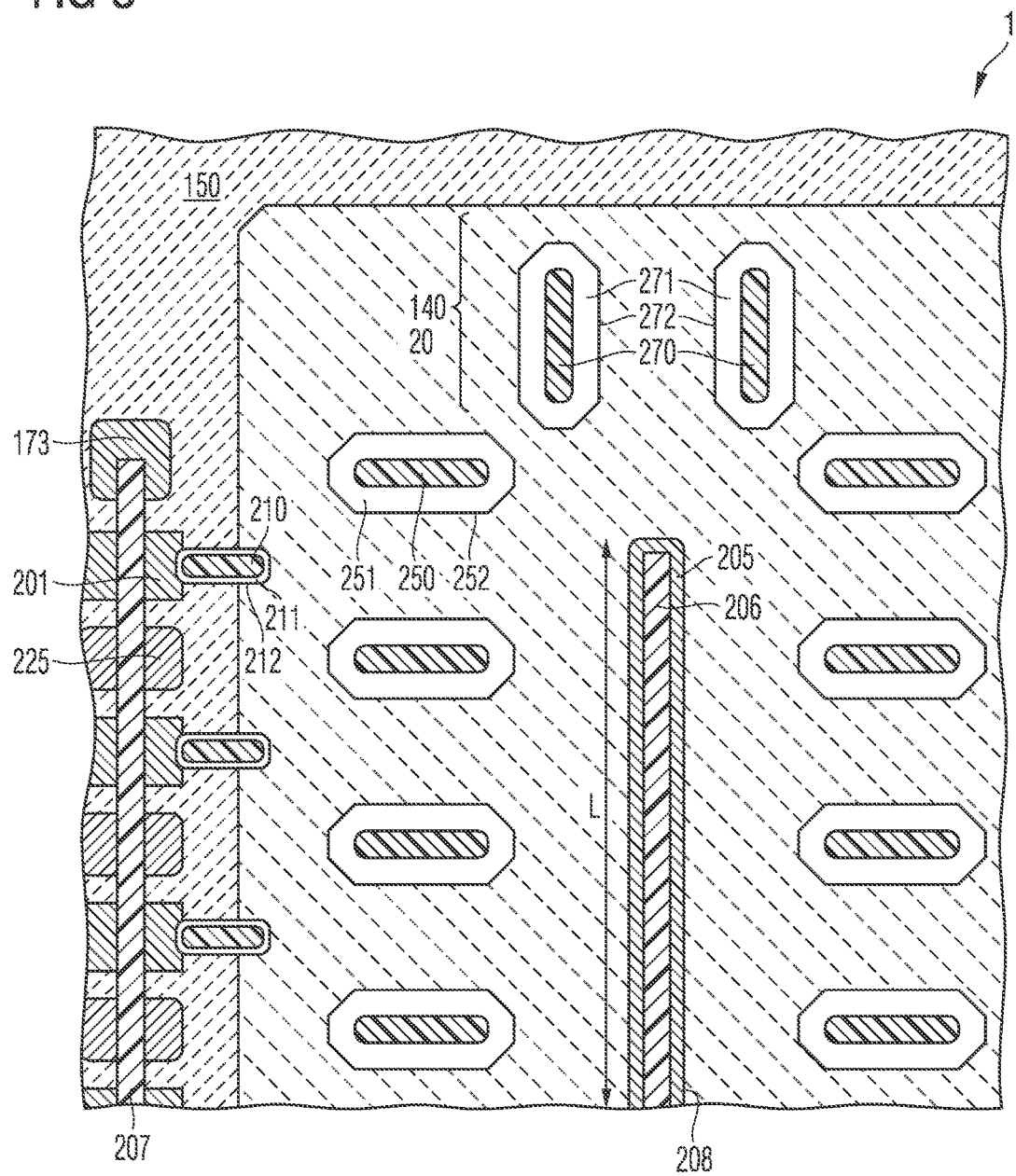
FIG. 3 shows a horizontal cross-sectional view of a semiconductor device according to a further embodiment.

FIG. 3 shows a horizontal cross-sectional view of a semiconductor device according to a further embodiment. Differing from the embodiment shown in FIG. 1A, the second field plate trench 272 may have a longitudinal axis which only extends in the second direction without a portion extending in the first direction.

According to the embodiment shown in FIG. 3 the shape of the first field plate trenches 252 and of the second field plate trenches 272 may be further modified thereby improving the performance of the semiconductor device. According to an embodiment, as is shown in FIG. 3, the drain region 205 has a shorter length L measured in the second direction than according to the embodiment shown in FIG. 1A. As a result, the breakdown voltage at the termination region 20 may be further increased.

Figure 4:
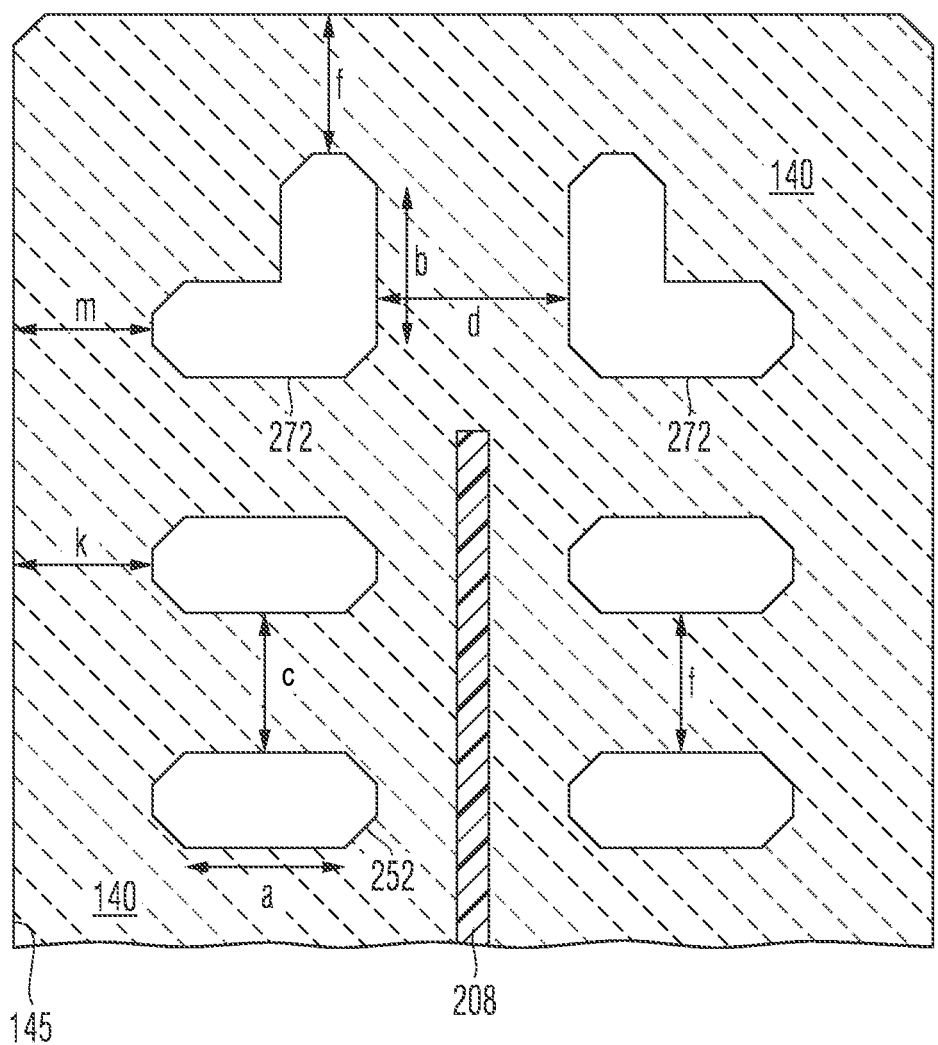
FIG. 4 shows a horizontal cross-sectional view illustrating further elements of the semiconductor device.

FIG. 4 shows further possible layouts and structural designs of the first field plate trench 252 and the second field plate trench 272, respectively. As is shown, the first field plate trenches 252 have a length a measured in the first direction and a distance c from each other, the distance being measured in the second direction. Further, the first field plate trenches 252 have a distance k to the boundary 145 between the first substrate portion 140 and the second substrate portion 150. Further, the second field plate trench 272 has a length b measured along the second direction and a distance d from an adjacent second field plate trench 272. The distance d is measured along the first direction. The second field plate trench 272 has a distance m to the boundary 145 between the first substrate portion 140 and the second substrate portion 150 measured along the first direction and a second distance f measured along the second direction to the boundary 145. According to embodiments, the length a of the first field plate trench 252 equals the length b of the second field plate trench 272. Further, a distance c between adjacent first field plate trenches 252 equals a distance d measured between adjacent second field plates. Moreover, the first distance of the second field plate trench 272 to the boundary 145 equals the second distance f to the boundary 145. As a result, the breakdown voltage of the semiconductor device is uniform in the various directions of possible current flow.

Figure 5:
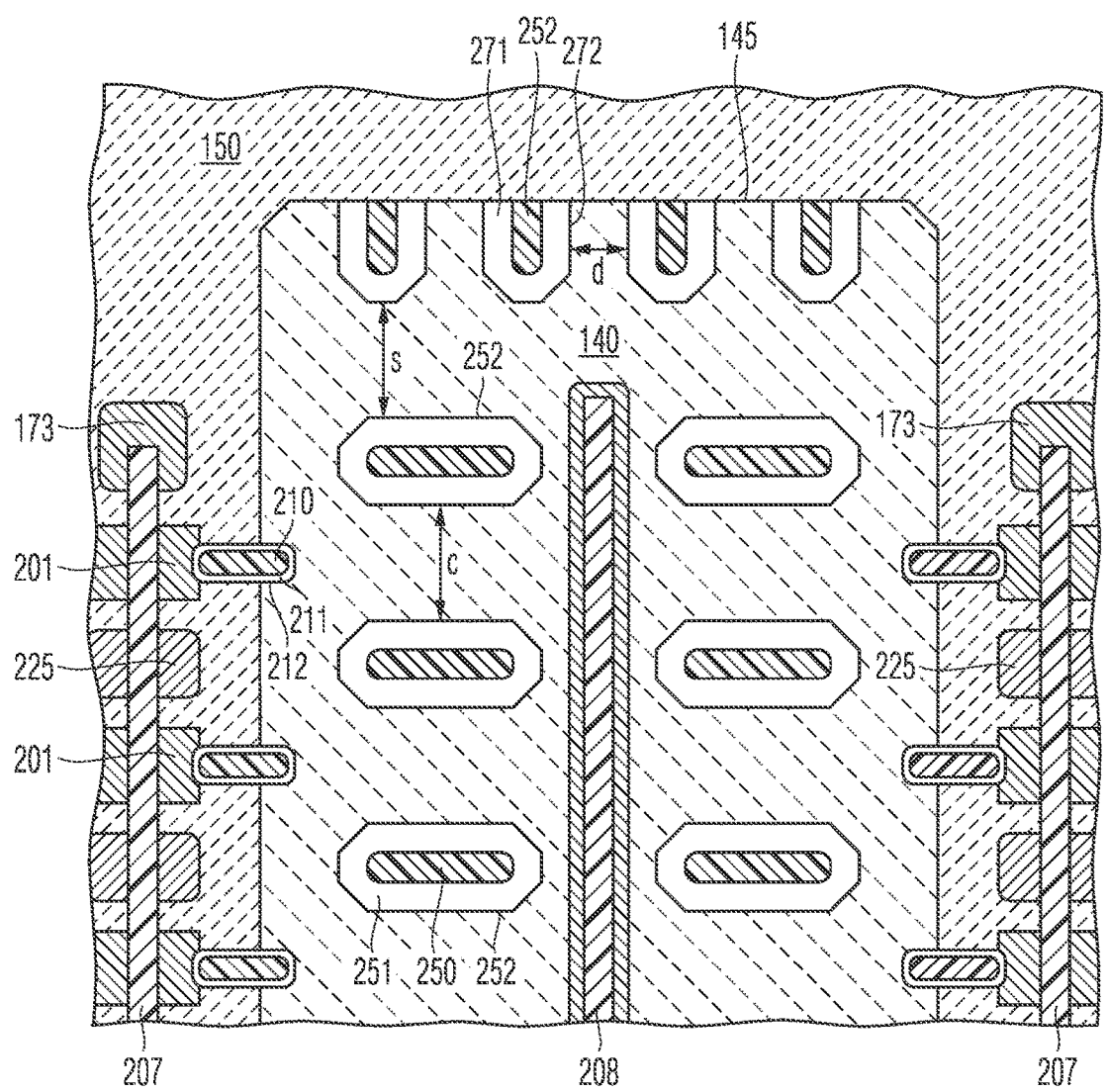
FIG. 5 shows a horizontal cross-sectional view of a semiconductor device according to a further embodiment.

FIG. 5 shows a horizontal cross-sectional view of a semiconductor device according to still a further embodiment. As is shown, the semiconductor device comprises a plurality of second field plate trenches 272 that extend along the first direction along the boundary 145 between the first substrate portion 140 and the second substrate portion 150. According to an embodiment, the distance between the second field plate trenches 272 to an adjacent first field plate trench 252 measured in the second direction approximately equals the distance c between adjacent first field plate trenches 252. For example, a deviation may be less than 20%, e.g. less than 10%. As a result, the breakdown characteristics of the device may be further improved.

According to the embodiments described herein, the semiconductor device comprises a power transistor in the semiconductor substrate 100. The semiconductor substrate 100 comprises a first substrate portion 140 of a first conductivity type at the main surface 110 of the semiconductor substrate and a second substrate portion 150 of the second conductivity type at the main surface 110. The power transistor comprises a drift zone 260 which is formed in the first semiconductor substrate portion 140. The power transistor further comprises a plurality of first field plates 250 which are arranged in the drift zone 260. Longitudinal axes of the first field plates 250 extend in a first horizontal direction. The semiconductor device further comprises a second field plate 270. A longitudinal axis of the second field plate 270 extends in a second horizontal direction perpendicular to the first direction. As has been described herein above, the gate electrodes 210 and the field plates 250 may be arranged in gate trenches 212 and field plate trenches 252, respectively. Further, the second field plates 270 may be arranged in second field plate trenches 272. As is to be clearly understood, the gate electrodes 210 and the first and second field plates 250, 270 or part of these components may be implemented as planar components. Accordingly, any of these components may be entirely disposed over the first main surface 110 of the semiconductor substrate.

The semiconductor device further comprises a source region 201 and a drain region 205. The source region 201 and the drain region 205 are arranged along the first horizontal direction. According to an embodiment, the semiconductor device may further comprise a source contact electrically connected to the source region 201. The source contact may comprise a first source contact portion 204 and a second source contact portion 240. The second source contact portion 240 may be disposed at the second main surface 120 of the semiconductor substrate 100. The first source contact portion 204 comprises a source contact filling 202 in direct contact with the source region 201 and a portion of the semiconductor substrate 100 arranged between the source contact filling 202 and the second source contact portion 240.

Figure 6A:
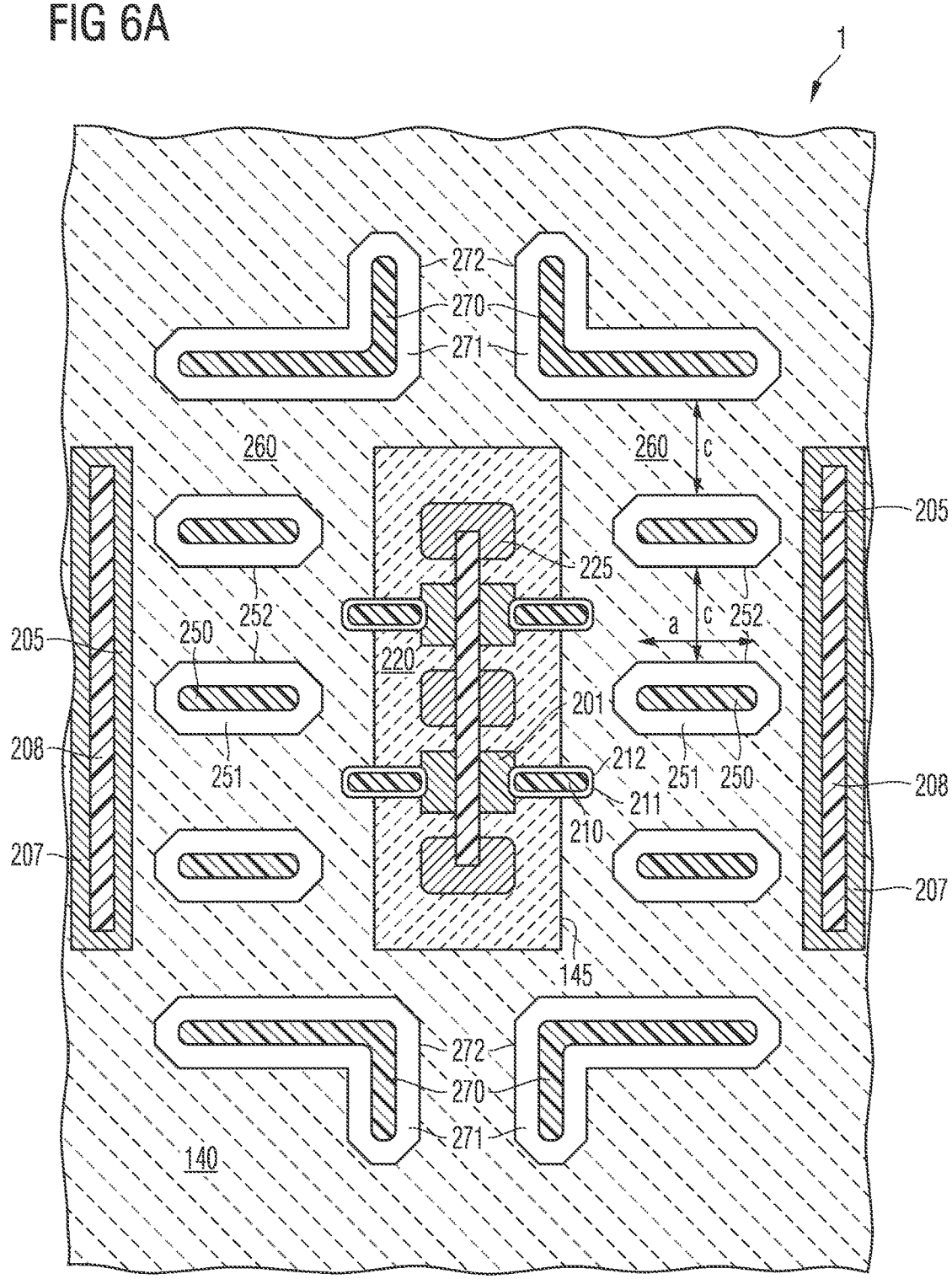
FIG. 6A shows a horizontal cross-sectional view of a semiconductor device according to a further embodiment.

FIG. 6A shows a horizontal cross-sectional view of a semiconductor device according to a further embodiment. According to the layout shown in FIG. 6A, the second substrate portion 150 is disposed in a central portion of the transistor cell array. The first substrate portion 140 may surround the second substrate portion 150. The source contact groove 207 may be arranged in a central portion of the transistor cell array and of the second substrate portion 150. The drain contact groove 208 may be disposed outside the transistor cell array and in the first substrate portion 140. The first substrate portion 140 may be electrically connected to the drain terminal via the doped contact portion 174 of the first conductivity type horizontally arranged adjacent to and in contact with the drain contact groove 208.

Figure 6B:
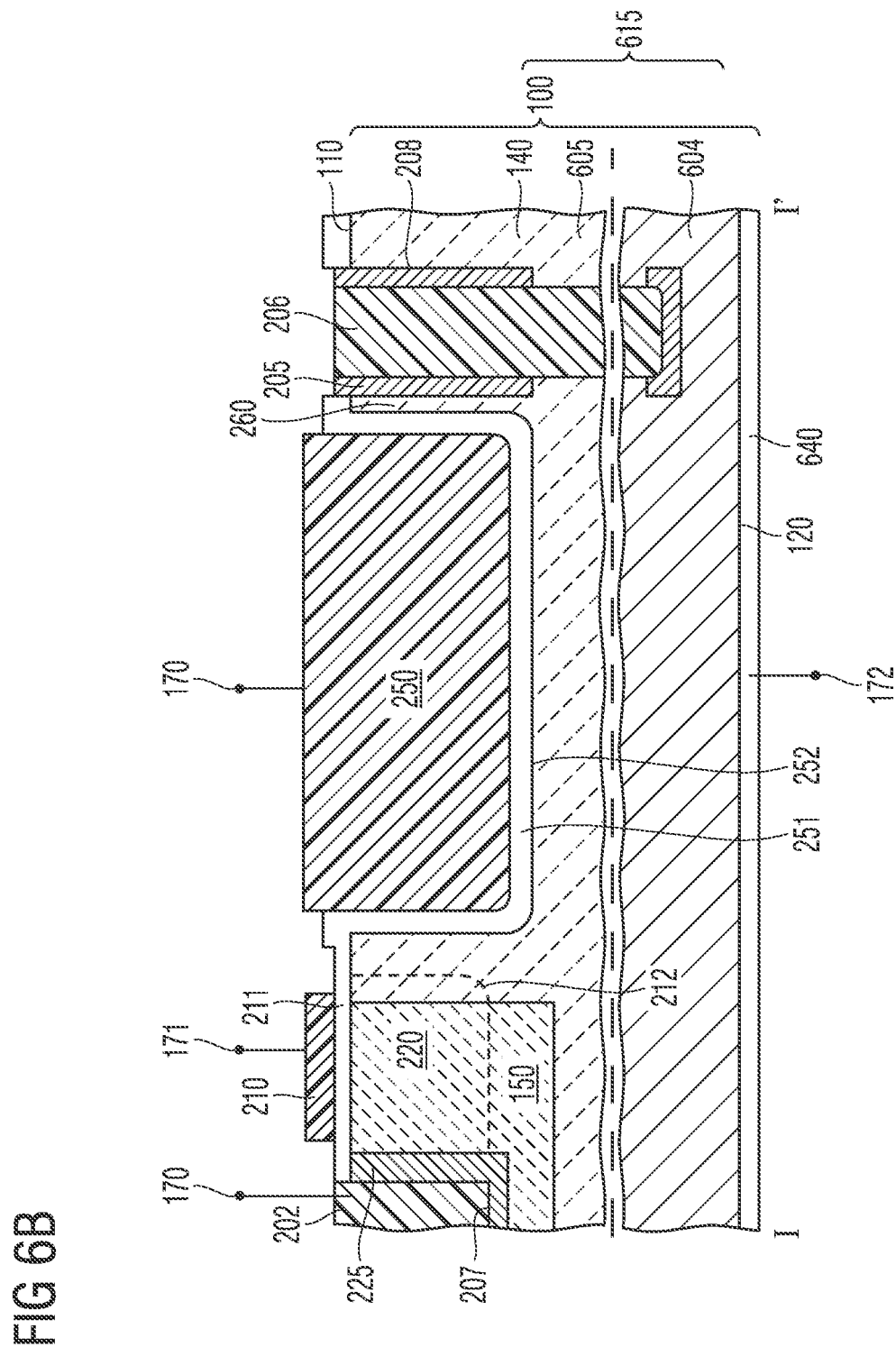
FIG. 6B shows a vertical cross-sectional view of the semiconductor device.

FIG. 6B shows a vertical cross-sectional view of the semiconductor device illustrated in FIG. 6A. The semiconductor device further comprises a drain contact electrically connected to the drain region 205. The drain contact comprises a first drain contact portion 615 and a second drain contact portion 640. The second drain contact portion 640 is disposed at the second main surface 120 of the semiconductor substrate 100. For example, the second drain contact portion 640 may be implemented by a back side metallization layer.

The first drain contact portion 615 comprises a drain contact filling 206 in direct contact with the drain region 205. The first drain contact portion further comprises a portion of the semiconductor substrate 100 arranged between the drain contact filling 206 and the second drain contact portion 640.

For example, as is illustrated in FIG. 6B, the semiconductor substrate 100 may comprise a base layer 604 of the first conductivity type. An upper portion 605 of the base layer may be doped at a lower doping concentration than a lower portion. The first semiconductor substrate portion 140 of the first conductivity type and the second semiconductor substrate portion 150 of the second conductivity type at a lower doping concentration than the first semiconductor substrate portion 140 may be arranged over the upper portion 605 of the base layer. According to this embodiment, the first drain contact portion 615 may further comprise a portion of the base layer 604. For example, the drift zone 260 may be arranged in the first semiconductor substrate portion. The body region 220 may be arranged in the second semiconductor substrate portion 150. A portion of the upper portion 605 of the base layer may be arranged beneath the body region 220.

Figure 7:
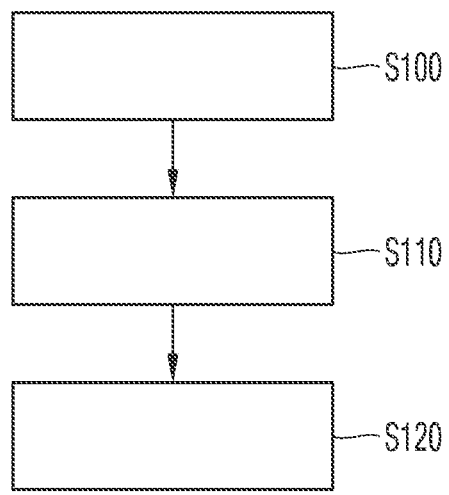
FIG. 7 summarizes a method of manufacturing a semiconductor device.

FIG. 7 summarizes a method according to an embodiment. As is shown, a method of manufacturing a semiconductor device comprising a power transistor in a semiconductor substrate comprises defining S100 a first substrate portion 140 of a first conductivity type at a main surface of the semiconductor substrate and a second substrate portion of a second conductivity type at the main surface, thereby defining a drift zone. The method further comprises forming S110 a plurality of first field plates in the drift zone, longitudinal axes of the first field plates extending in a first horizontal direction. The method further comprises forming S120 a second field plate, wherein the longitudinal axis of the second field plate extends in a second horizontal direction perpendicular to the first direction.

Due to the specific structure of the second field plates, the termination region 20 of the semiconductor device 1 may be formed in a simple manner. In particular, due to this feature, the first semiconductor substrate portion 140 may be formed e.g. by epitaxial growth or implantation over the whole main surface of a workpiece. For example, for manufacturing the semiconductor device, first, the first semiconductor substrate portion 140 is formed by epitaxial growth or implantation which is unmasked, followed by a masked doping process to form the second semiconductor substrate portion 150 of the second conductivity type. As a result, the process for manufacturing the semiconductor device may be further simplified.

Figure 8:
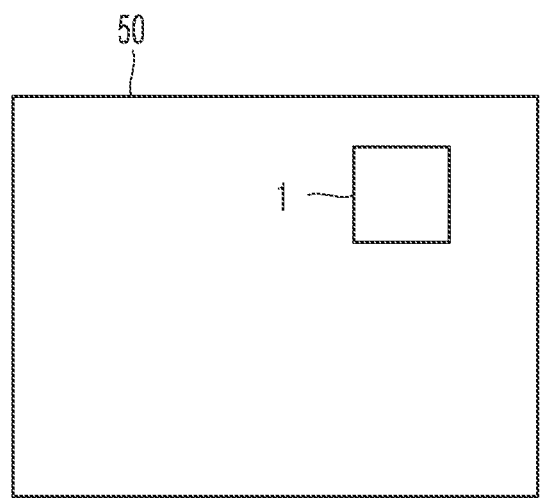
FIG. 8 shows a schematic view of an electronic device according to an embodiment.

FIG. 8 shows a schematic view of an electronic device 50 according to an embodiment. An electronic device 50 may comprise the semiconductor device 1 as described hereinabove. For example, the electronic device may be selected from the group of a DCDC converter, bridge circuit, a converter, an inverter and a motor drive.

While embodiments of the invention have been described above, it is obvious that further embodiments may be implemented. For example, further embodiments may comprise any subcombination of features recited in the claims or any subcombination of elements described in the examples given above. Accordingly, this spirit and scope of the appended claims should not be limited to the description of the embodiments contained herein.

What is claimed is:

1. A semiconductor device in a semiconductor substrate having a first main surface including a transistor array and a termination region, the transistor array comprising:
   a source region;
   a drain region;
   a body region;
   a drift zone; and
   a gate electrode at the body region, the gate electrode being configured to control a conductivity of a channel in the body region, the body region and the drift zone being disposed along a first horizontal direction between the source region and the drain region,
   the transistor array further comprising first field plate trenches in the drift zone, a longitudinal axis of the first field plate trenches extending in the first horizontal direction,
   the semiconductor device further comprising a second field plate trench, a longitudinal axis of the second field plate trench extending in a second horizontal direction perpendicular to the first direction,
   wherein the second field plate trench is merged with one of the first field plate trenches.

2. The semiconductor device of claim 1, wherein the second field plate trench is arranged in the termination region.

3. The semiconductor device of claim 1, wherein the gate electrode is disposed in gate trenches in the first main surface extending in the first direction.

4. The semiconductor device of claim 1, wherein a plurality of second field plate trenches is arranged along the first direction in the termination region, a longitudinal direction of the plurality of second field plate trenches extending in the second direction.

5. The semiconductor device of claim 1, further comprising a first field plate in the first field plate trenches and a second field plate in the second field plate trench, the first field plate and the second field plate being electrically connected to a common terminal.

6. The semiconductor device of claim 1, wherein the semiconductor device comprises at least two second field plate trenches, wherein the first field plate trenches are arranged at a distance c, and wherein the at least two second field plate trenches are arranged at a distance d, and $|c-d|/c<0.2$.

7. The semiconductor device of claim 1, wherein each of the first field plate trenches has a length a measured along the first direction, wherein the second field plate trench has a length b measured along the second direction, and wherein $|a-b|/a<0.2$.

8. The semiconductor device of claim 1, wherein a distance of the first field plate trenches to the second substrate portion in the first direction is equal to the distance of the second field plate trench to the second substrate portion in the second direction.

9. The semiconductor device of claim 1, further comprising a source contact electrically connected to the source region, the source contact comprising a first source contact portion and a second source contact portion, wherein the second source contact portion is disposed at a second main surface of the semiconductor substrate, and wherein the first source contact portion comprises a source contact filling in direct contact with the source region and a portion of the semiconductor substrate arranged between the source contact filling and the second source contact portion.

10. The semiconductor device of claim 1, further comprising a drain contact electrically connected to the drain region, the drain contact comprising a first drain contact portion and a second drain contact portion, wherein the second drain contact portion is disposed at a second main surface of the semiconductor substrate, and wherein the first drain contact portion comprises a drain contact filling in direct contact with the drain region and a portion of the semiconductor substrate arranged between the drain contact filling and the second drain contact portion.

11. An electronic device comprising the semiconductor device of claim 1, the electronic device being selected from the group consisting of a bridge circuit, a converter, an inverter and a motor drive.

12. A semiconductor device comprising a power transistor in a semiconductor substrate, the semiconductor substrate comprising a first semiconductor substrate portion of a first conductivity type at a first main surface of the semiconductor substrate and a second substrate portion of a second conductivity type at the first main surface, the power transistor comprising:
   a drift zone in the first semiconductor substrate portion,
   a plurality of first field plates in the drift zone, longitudinal axes of the first field plates extending in a first horizontal direction,
   a second field plate, the longitudinal axis of the second field plate extending in a second horizontal direction perpendicular to the first direction,
   a source region and a drain region, the source region and the drain region being arranged along the first horizontal direction, and
   a source contact electrically connected to the source region, the source contact comprising a first source contact portion and a second source contact portion, wherein the second source contact portion is disposed at a second main surface of the semiconductor substrate, and wherein the first source contact portion comprises a source contact filling in direct contact with the source region and a portion of the semiconductor substrate arranged between the source contact filling and the second source contact portion.

13. A method of manufacturing a semiconductor device comprising a power transistor in a semiconductor substrate, the method comprising:
- defining a first semiconductor substrate portion of a first conductivity type at a main surface of the semiconductor substrate and a second semiconductor substrate portion of a second conductivity type at the main surface, to form a drift zone in the first semiconductor substrate portion;
- forming a plurality of first field plates in the drift zone, longitudinal axes of the first field plates extending in a first horizontal direction; and
- forming a second field plate, a longitudinal axis of the second field plate extending in a second horizontal direction perpendicular to the first direction,
- wherein the second field plate is merged with one of the first field plates.

* * * * *